United States Patent
Beier et al.

(10) Patent No.: US 7,607,828 B2
(45) Date of Patent: Oct. 27, 2009

(54) METHODS AND SYSTEMS FOR PROTECTION FROM OVER-STRESS

(75) Inventors: Robert Carl Beier, St. Clair, MI (US); Raymond Joseph Notarantonio, Novi, MI (US)

(73) Assignee: Infineon Technologies AG, Munich (DE)

( * ) Notice: Subject to any disclaimer, the term of this patent is extended or adjusted under 35 U.S.C. 154(b) by 251 days.

(21) Appl. No.: 11/525,474

(22) Filed: Sep. 22, 2006

(65) Prior Publication Data
US 2008/0075142 A1   Mar. 27, 2008

(51) Int. Cl.
*G01K 7/00* (2006.01)
*G01K 3/00* (2006.01)
*H02H 5/04* (2006.01)

(52) U.S. Cl. .................. 374/163; 374/102; 374/107; 374/178; 361/103

(58) Field of Classification Search ............... 374/103, 374/178, 170, 102, 163; 361/103
See application file for complete search history.

(56) References Cited

U.S. PATENT DOCUMENTS

| | | | |
|---|---|---|---|
| 4,903,106 A | 2/1990 | Fukunaga et al. | |
| 5,497,285 A | 3/1996 | Nadd | |
| 5,555,152 A | 9/1996 | Brauchle et al. | |
| 6,807,507 B2 | 10/2004 | Kumar et al. | |
| 6,819,091 B2 | 11/2004 | Ishihara et al. | |
| 2005/0231146 A1 | 10/2005 | De Frutos et al. | |
| 2007/0103833 A1* | 5/2007 | Harris | ............. 360/103 |

OTHER PUBLICATIONS

Infineon Technologies, "Addendum for PCN 2004-018-A, BTS 5240 G", Aug. 2004, 18 pgs.
Siemens, Semiconductor Group, PROFET® Functional Description & Application Notes, Mar. 4, 1997, 10 pgs.
Siemens, Semiconductor Group, PROFET-Description, Mar. 4, 1997, 10 pgs.

* cited by examiner

*Primary Examiner*—Gail Verbitsky
*Assistant Examiner*—Mirellys Jagan
(74) *Attorney, Agent, or Firm*—Eschweiler & Associates, LLC (57) ABSTRACT

One embodiment of the invention relates to a circuit for over-stress protection. The circuit includes a temperature rate sensor configured to monitor the temperature of a semiconductor device during a first state. The circuit is further configured to selectively switch the semiconductor device from the first state to a second state if the temperature increases at a rate that has a predetermined relationship with a temperature rate function. Other methods and systems are also disclosed.

15 Claims, 5 Drawing Sheets

METHODS AND SYSTEMS FOR PROTECTION FROM OVER-STRESS

FIELD OF THE INVENTION

The present invention relates generally to semiconductor devices, and more specifically to methods and systems for protection from over-stress.

BACKGROUND OF THE INVENTION

Over-stress can often be caused by overload or faulted operating conditions and can impart, for example, thermo-mechanical stress on an integrated circuit, which can eventually lead to failure of the circuit.

For example, if a MOSFET device operates at a temperature above its maximum critical temperature, electrical over-stress can cause the MOSFET to eventually fail. Because electrical over-stress can affect the reliability of practically all integrated circuits to some extent, improvements in over-stress detection and protection are always ongoing. As such improvements can extend the lifetime of integrated circuits and devices connected thereto, these improvements are a valuable contribution to the marketplace.

SUMMARY OF THE INVENTION

One embodiment relates to a method for protecting a semiconductor device from over-stress. In the method, the temperature of a semiconductor device is monitored during an on-state. To facilitate switching the semiconductor device from the on-state to an off-state to protect from over-stress, a temperature rate associated with the monitored temperature is compared to a predetermined temperature rate function.

DETAILED DESCRIPTION OF THE INVENTION

The present invention will now be described with respect to the accompanying drawings in which like numbered elements represent like parts. The figures and the accompanying description of the figures are provided for illustrative purposes.

Figure 1:
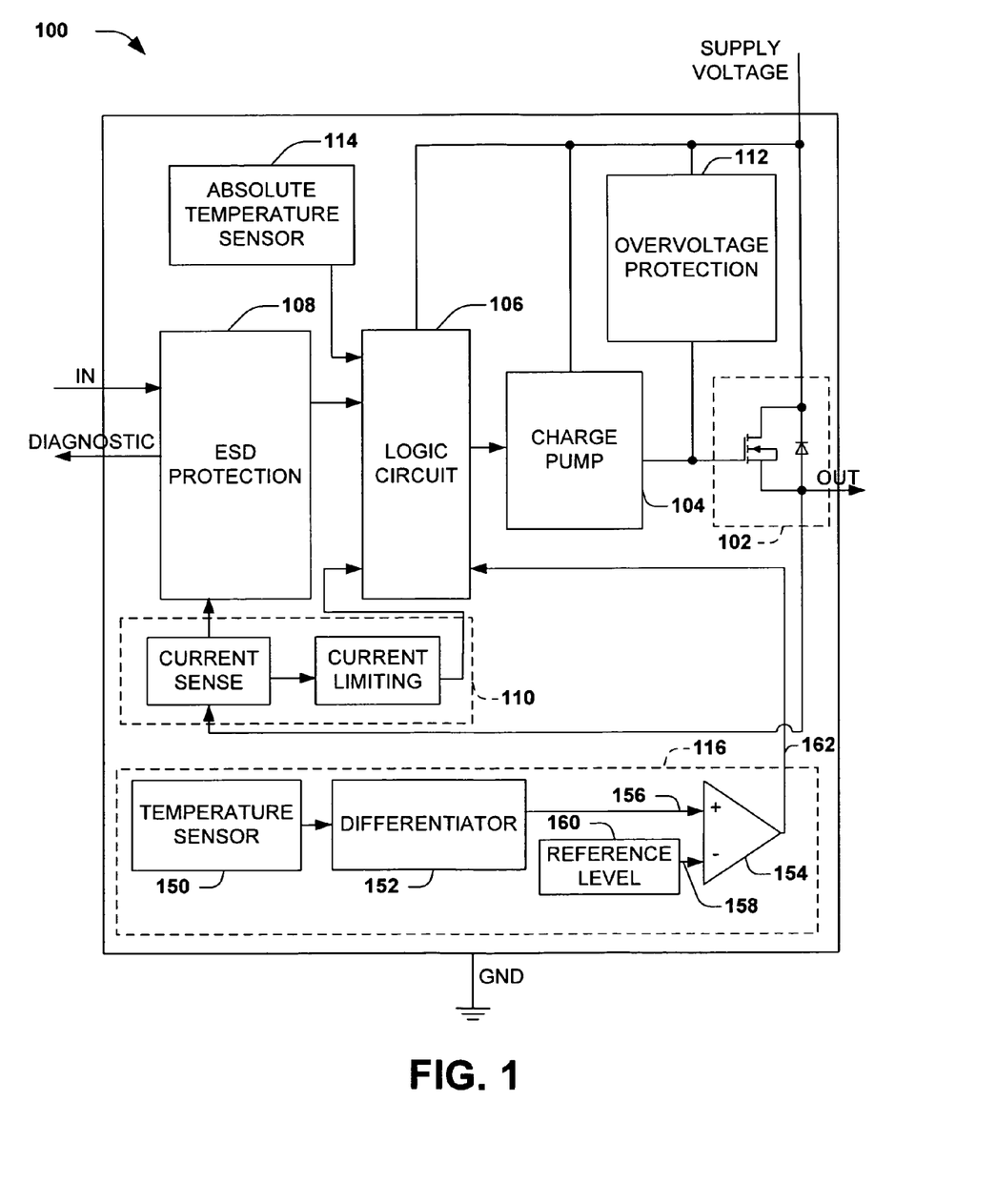
FIG. 1 is a block diagram of one embodiment capable of providing protection against over-stress.

FIG. 1 shows one embodiment of a circuit 100 capable of providing protection against electrical over-stress and other protection functions. The illustrated circuit 100 relates to a power switch that combines MOS power and MOS logic circuitry. The circuit 100 can be a monolithic single- or multi-channel switch, or a single channel switch using chip-on-chip technology. Other suitable arrangements could also be utilized.

As shown, the circuit 100 includes a semiconductor device 102 (e.g., a vertically structured N-channel power transistor), a charge pump 104 for high side operation, and a logic circuit 106 for facilitating various protection functions. Although the illustrated circuit shows a semiconductor device 102 as a vertically structured N-channel power transistor, in other embodiments the semiconductor device could include, but is not limited to: MOS transistors, NPN or PNP bipolar junction transistors, and any other type of power semiconductor device.

During normal operation, the charge pump 104 generates the gate control signal for high side operation of the semiconductor device 102, which is activated via the ESD-protected input terminal 108 and the logic circuit 106. The charge pump 104 is activated by the logic control signal, and multiplies the supply voltage to drive the gate of the semiconductor device 102. In one embodiment, the charge pump 104 can double or triple the supply voltage.

In addition to the overstress protection functions discussed below, the illustrated circuit can include other various protection functions via suitable circuitry, including but not limited to: temperature protection, current limiting protection 110, overvoltage protection 112 (including load dump), short-circuit protection, overload protection, fast demagnetization of inductive loads, reverse battery protection, undervoltage and overvoltage shutdown with auto-restart and hysteresis diagnostic feedback, open load detection, CMOS and TTL compatible input, and proportional load current sense.

As further illustrated, the illustrated circuit 100 includes temperature sensors such as an absolute temperature sensor 114 and a temperature rate sensor 116, both of which suitably interface with the circuit 100 to provide over-temperature protection. The temperature rate sensor 116 can be configured to protect against electrical over-stress, metal fatigue, or metal cracking, bond wire pull off, and other mechanisms caused by elevated absolute temperatures.

The absolute temperature sensor 114 protects the device 102 against an increase in temperature by selectively turning off the device 102 if the circuit is subject to a temperature that is greater than a maximum or threshold absolute temperature. In various embodiments, the maximum temperature could be approximately 150° C., approximately 175° C., or some other value. Thus, if the temperature of the circuit exceeds the maximum temperature, the absolute temperature sensor 114 delivers a signal to the logic circuit 106, which in turn causes the charge pump 104 to turn off the semiconductor device 102. The absolute temperature protection may be independent of whether the cause of the temperature is internal (e.g., excessive power dissipation) or external (e.g., ambient influences).

In one embodiment, the absolute temperature sensor 114 uses a sensor that is embedded in the same substrate within the power stage or power element of the circuit 100. One absolute temperature sensor uses the thermal properties of a diode to create a temperature response or signal. One typical silicon diode has a negative temperature coefficient of approximately 1.8 millivolts per degree Celsius (mv/° C.) for a given constant bias current. Thus, for such a forward biased diode, if the temperature decreases by 5° C., the voltage drop across the diode, which would decrease by approximately 9 mV, could be measured to create the temperature signal. Other absolute temperature sensors could include, but are not limited to leakage current measurement of BJT or MOS devices. The absolute temperature sensor 114 can be independent of the temperature rate sensor 116 in one embodiment.

In addition to the absolute temperature sensor 114, the illustrated circuit includes a temperature rate sensor 116. The temperature rate sensor 116 monitors the time rate of temperature change of the semiconductor device 102 during a first state (e.g., when the device is on). The circuit 100 is configured to selectively switch the semiconductor device 102 from the first state to a second state (e.g., turn the device off) if the temperature increases at a time rate that is higher than a temperature rate function.

In one embodiment, the temperature rate sensor 116 could monitor the temperature of a semiconductor device (e.g., an N-channel power transistor) just after the device enters an on-state. This temperature monitoring and change of state can occur, for example, during a period of high inrush current (e.g., due to a cold bulb filament load). If the temperature increases at a rate that is higher than the temperature rate function, the circuit 100 switches the transistor to an off-state before the temperature exceeds the maximum or threshold temperature of the absolute temperature sensor. Thus, a temperature rate sensor 116 can turn off a semiconductor device at an early time that cannot be achieved with an absolute temperature sensor 114 alone, and can thereby limit the thermal-mechanical stress due to repeated or prolonged fast temperature variations above and beyond what is possible with an absolute temperature sensor.

One embodiment of a temperature rate sensor 116 is now described with reference to FIG. 1. As shown, one temperature rate sensor 116 includes a temperature sensor 150, a differentiator 152, and a comparator 154; all of which are operably coupled to one other.

The temperature sensor 150 monitors the junction temperature of the semiconductor device 102 and provides a temperature signal representative thereof. Typically, small sensors are generally favored because they provide a low thermal capacitance (e.g., they heat up quickly) and because they provide a low electrical capacitance (e.g., they provide a quick voltage response). In one embodiment, the response time is less than 10 microseconds. The temperature sensor 150 can be embedded in the same substrate within the power stage or power element of the circuit. Typically, the closer that the sensor is to the heat source in the power element, the better the sensor 150 performs.

One temperature sensor 150 monitors the thermal properties of a diode to create the temperature response or signal. As previously mentioned, typical silicon diodes have a negative temperature coefficient of approximately 1.8 (mv/° C.) and can be used to create the temperature signal. Other temperature sensors could include, but are not limited to: BJTs, MOSFETs, and the like.

A differentiator 152 is coupled to the temperature sensor 150 and provides a differentiated temperature signal that is representative of the rate of change of the device junction temperature with respect to time. Differentiators can vary in their bandwidth, thus the speed/frequency of signals they are able to process may also vary. Generally, a suitable differentiator 152 has a higher bandwidth than the temperature sensor 150. Typical differentiators have a temperature stable offset voltage.

Coupled to differentiator 152 is a comparator 154, which compares the voltage of a first comparator input node 156 (e.g., coupled to the differentiator 152) to the voltage of a second comparator input node 158 (e.g., coupled to a reference level 160). To indicate which voltage is larger, the comparator 154 switches the state of a comparator output value signal, which is provided at the output node 162 and can be coupled to the logic circuit 106.

The reference level 160 is representative of a predetermined temperature rate function above which undesirable current effects may occur (e.g., electrical over-stress, metal cracking, etc.). In one embodiment, the predetermined temperature rate function could be approximately 60° C. per millisecond, or some other suitable value; and the semiconductor device 102 could be switched from the first state to the second state (e.g., turned off) at that point. In one or more embodiments, the reference level may be adjustable, for example, by being tied to a user-accessible pin of the circuit to which resistors or other discrete parts could be coupled. By providing an adjustable reference level, a purchaser of the circuit could tailor the circuit to suit his or her unique design constraints.

Thus, if the differentiated temperature signal (measured temperature rate) exceeds the reference level (predetermined temperature rate function), then the temperature rate sensor 116 will provide a signal to the logic circuit 106, which will in turn provide a logic control signal by which the charge pump 104 will switch the semiconductor device 102 from the first state to the second state (e.g., turn a MOSFET off).

Figure 2A:
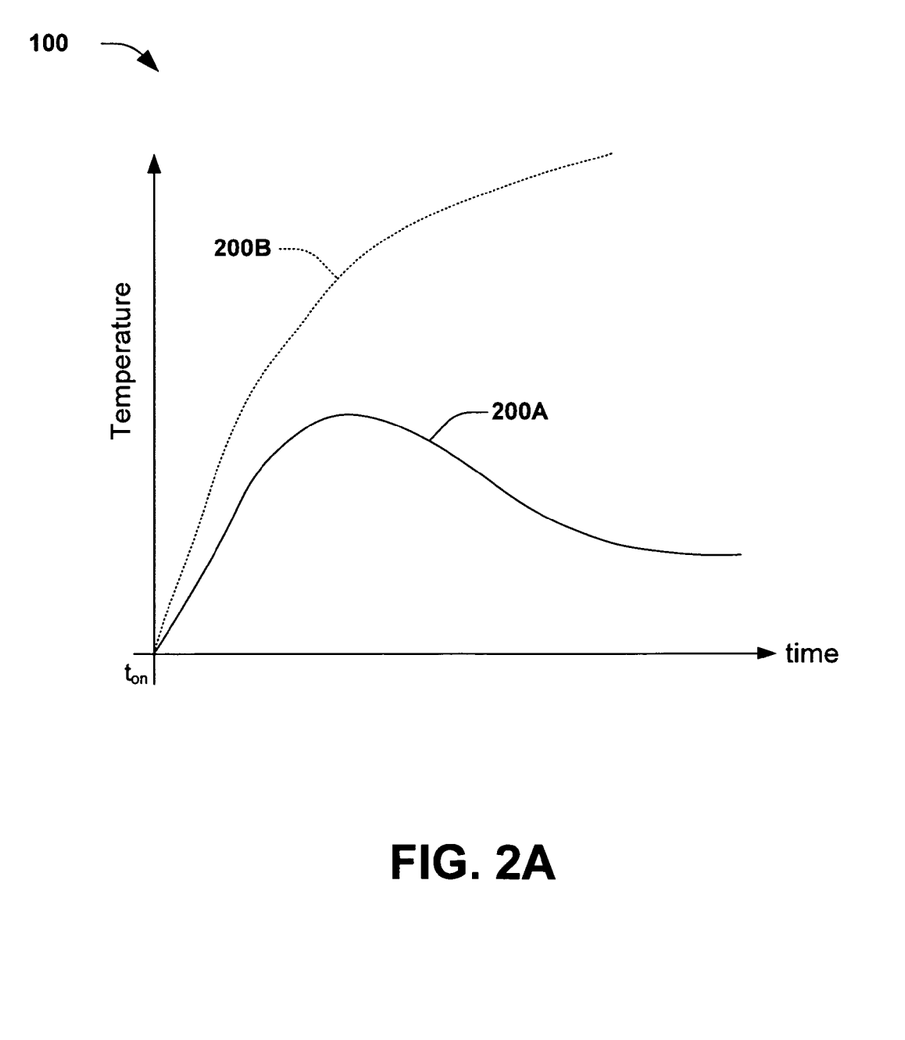
FIGS. 2A-2C relate to one embodiment of a circuit for providing over-stress protection.

In some instances, it might be difficult to distinguish between a true fault condition (e.g., short circuit) and a short term overload condition (e.g., high inrush current from a cold bulb filament). For example, one embodiment in FIG. 2A shows a temperature signal of both an overload condition 200A (acceptable) and a fault condition 200B (unacceptable) as a function of time. During device turn-on, the overload condition 200A and fault condition 200B could result in similar rate increases in the temperature of the semiconductor device 102 with respect to time. After a period of time, the overload condition 200A will exhibit a lower rate increase in junction temperature than the fault condition 200B with respect to time. To remedy the difficulty in distinguishing true fault conditions from overload conditions, in one embodiment an integrator and a time period circuit (e.g., one shot circuit) are added to the temperature rate sensor 116. The differentiator can be used to enable the integrator. By integrating over a time window, an integration result of the fault condition will be greater than an integration result of the overload condition. Thus, the system can more accurately distinguish between overload conditions (acceptable) and fault conditions (unacceptable).

Figure 2B:
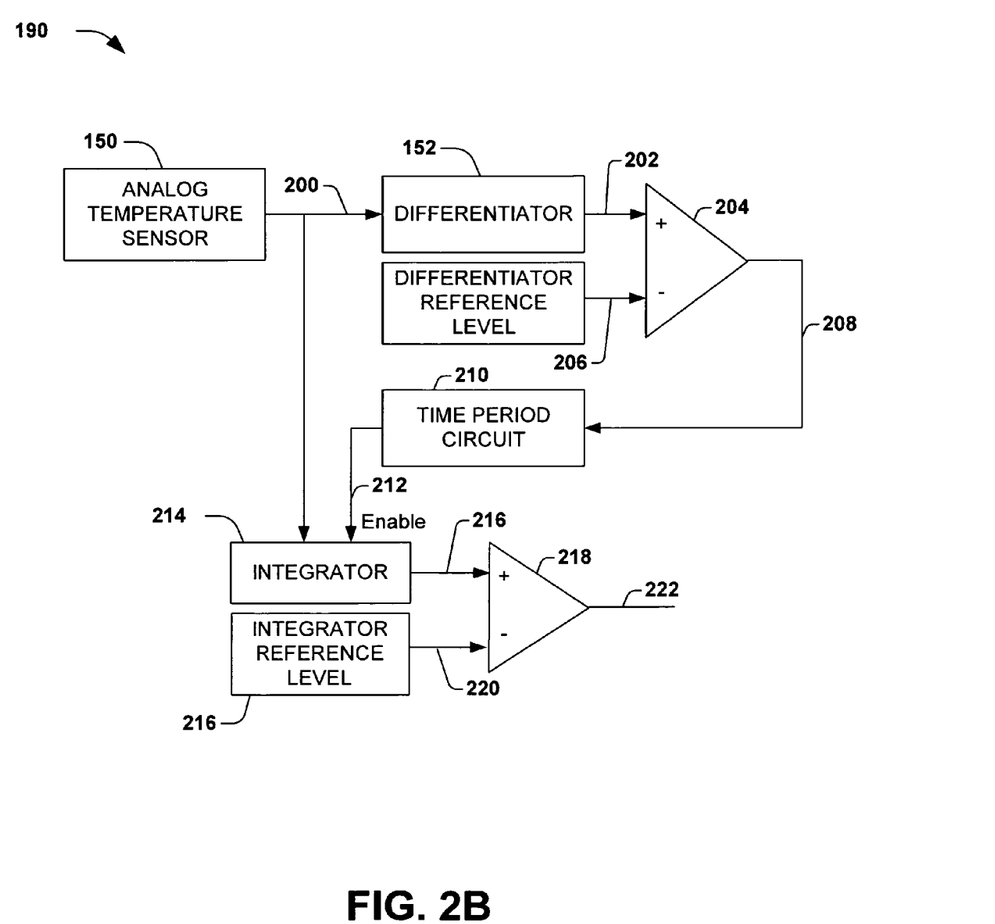

One such embodiment of a temperature rate sensor is now discussed with reference to FIG. 2B-2C, wherein elements from previous embodiments are indicated by like numerals. Notably, FIG. 2B shows a block diagram for one embodiment of a temperature rate sensor 190, and FIG. 2C describes the functionality of the temperature rate sensor 190 with reference to three charts, each of which shows one function of an overload condition 200A (acceptable) and a fault condition 200B (unacceptable). As discussed in more detail below, the illustrated temperature rate sensor can be configured to monitor the temperature of the semiconductor device and integrate the temperature during an integration period, wherein the integration period starts when the rate of temperature increase is greater than a predetermined temperature function. If the integrated temperature is greater than a predetermined reference level, the circuit can turn-off the semiconductor device.

In FIG. 2B's illustrated embodiment, the temperature sensor 150 monitors the junction temperature of the semiconductor device 102 and provides a temperature signal (e.g., overload condition 200A or fault condition signal 200B) on node 200 as previously discussed.

The differentiator 152 receives the temperature signal 200 and differentiates the temperature signal with respect to time to provide a differentiated temperature signal 202 as previously discussed.

The comparator 204 compares the differentiated temperature signal 202 to a differentiator reference level 206 and switches its output state 208 to indicate which voltage is greater. Thus, when the differentiated temperature signal 202 exceeds the differentiator reference level 206, the comparator output signal 208 will switch state, for example, from a low-voltage to a high-voltage. In various embodiments, the reference level 206 is a predetermined temperature rate function that can be variable, adjustable, varying, or a constant. Other types of differentiator reference level are also contemplated as falling within the scope of the invention, including but not limited to: linear and non-linear functions and user-adjustable functions.

The time period circuit 210 receives the comparator output signal 208 and sets up a time window for the integration to occur therefrom. In one embodiment, the time period circuit 210 may be a one-shot circuit. Because the comparator output signal 208 may remain indefinitely high (or low), if integration is to occur for only a predetermined time window, the time period circuit 210 can provide an enabling signal on node 212 to the integrator 214 (e.g., as a voltage pulse having a time duration corresponding to the desired time of integration), wherein the enabling signal begins when the comparator output switches states and ends at a predetermined time after the comparator output switches states. The user could select the predetermined time, for example, to be on the order of microseconds or milliseconds, or some other time interval.

The integrator 214, which is coupled to both the time period circuit 210 and the temperature sensor 150, integrates the temperature signal 200 over the integration period that is initiated by the time period circuit 210, and provides an integrated temperature 216. A comparator 218 then compares the integrated temperature 216 to an integrator reference level 220. In one embodiment, the integrator reference level may be a temperature function that may be adjustable.

If the integrated temperature 216 is greater than the integrator reference level 216, then the comparator 218 can provide an output signal 222 by which the circuit 100 can turn the device 102 off as previously discussed. Further, in one embodiment, the output signal 222 can be coupled to the logic circuit 106 to facilitate device operation as previously discussed.

Figure 2C:
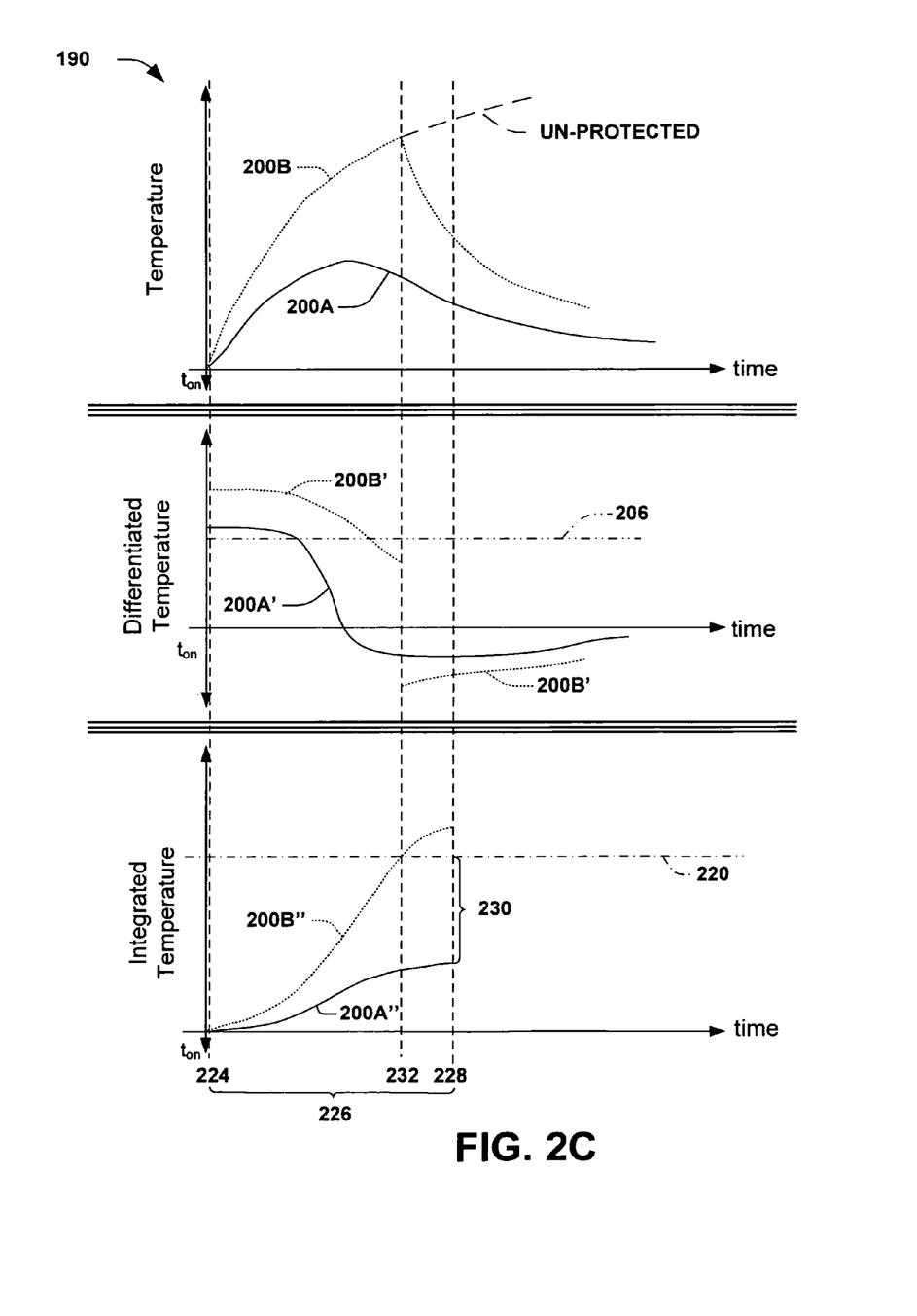

The top chart in FIG. 2C (Y-axis=Temperature) shows two illustrative temperature signals (overload condition 200A and fault condition 200B) that could be provided at node 200 by the temperature sensor 150 shortly after the semiconductor device 102 turns on.

The middle chart of FIG. 2C (Y-axis=Differentiated Temperature) shows the differentiated temperature of the overload condition 200A' and the fault condition 200B' as a function of time. The chart also illustrates one differentiator reference level 206, although other functions for the differentiator reference level are contemplated as falling within the scope of the invention, including but not limited to: linear and non-linear functions and user-adjustable functions.

The bottom chart of FIG. 2C (Y-axis=Integrated Temperature), shows two integrations performed by the integrator 214, both of which start at time 224 at which the differentiated temperatures 200A', 200B' are greater than the predetermined temperature rate reference level 206. Both integrations continue throughout integration period 226, wherein the end of the integration period is defined by time 228, which can be determined by time period circuit 210.

Thus, the integrator 214 starts integrating the temperature of the overload condition 200A at time 224 when the differentiated temperature signal of the overload condition 200A' exceeds the differentiator reference level 206. The integrator 214 then integrates over the integration period 226 that is provided by the time period circuit 210, thereby providing an integrated overload temperature 200A". Notably, the illustrative integrated overload temperature 200A" is less than the integrator reference level 220 by an amount 230. Therefore, with respect to the overload condition 200A, the integrated overload temperature 200A" is less than the integrator reference level 220, and the circuit 100 would leave the device 102 in an on-state because over-temperature protection is not presently needed.

With respect to fault condition 200B, the integrator 214 starts integrating at time 224 when the differentiated temperature signal of the fault condition 200B' exceeds the differentiator reference level 206. The integrator 214 then integrates for the integration period 226 to provide an integrated fault temperature 200B".

At time 232, the integrated fault temperature 200B" crosses the integrated reference level 220, at which point the temperature rate sensor 190 provides a signal that turns the device 102 off to protect it from electrical over-stress conditions. Thus, the top chart in FIG. 2C shows the temperature of the fault condition 200B falls at time 232, because the device 102 has been turned off. For illustrative purposes, the top chart also shows temperature curve ("un-protected"), in which the temperature rate sensor is not utilized, and thus the device remains in an on-state and the temperature continues to increase in time.

In various embodiments, the integrator 214 could continue to integrate until the end of the integration period 228 if a fault condition is detected (e.g., fault condition 200B" at time 232). In other embodiments, the integrator 214 could stop integrating when a fault is detected (e.g., at time 232).

Figure 3:
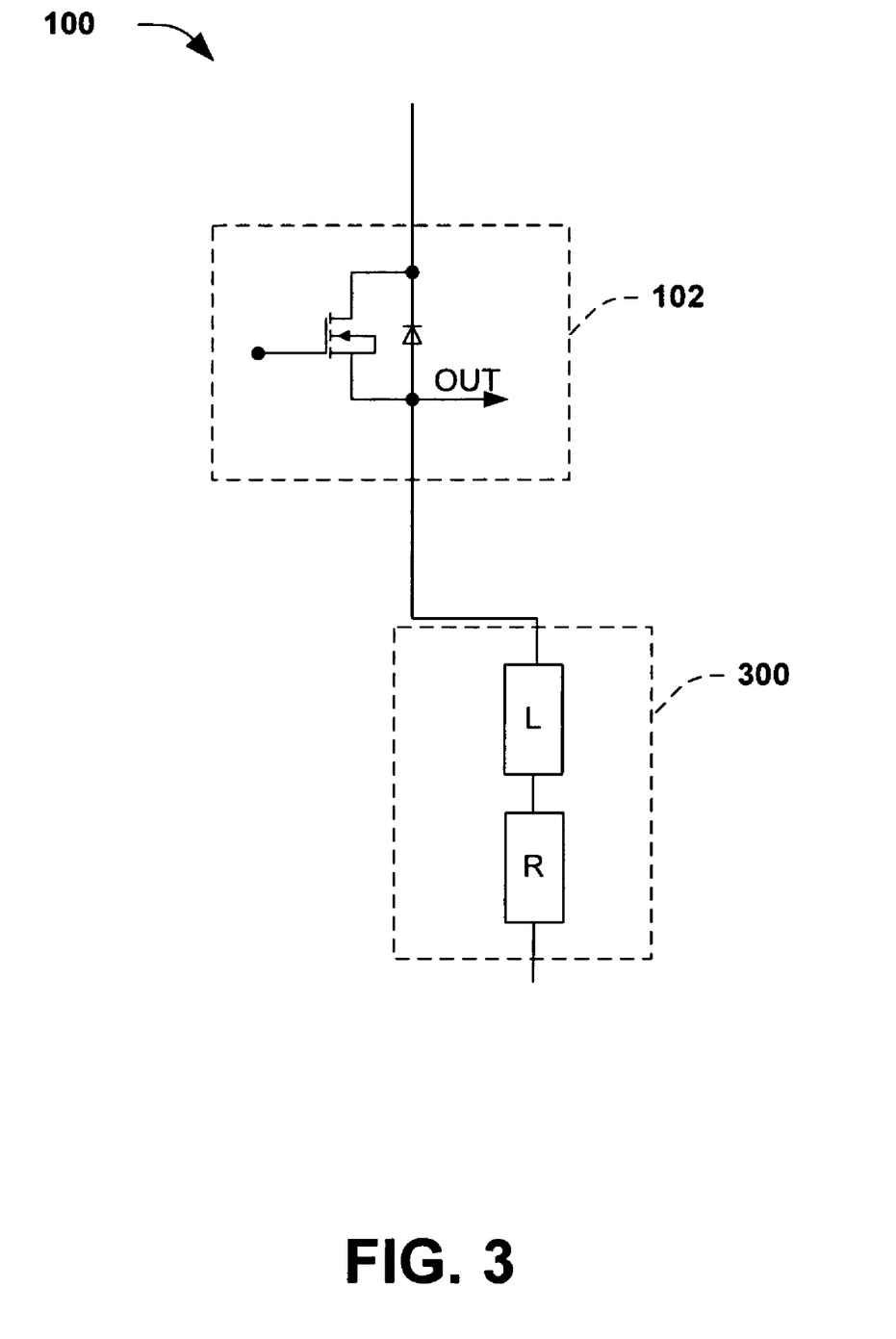
FIG. 3 relates to one embodiment that includes an inductive load.

In another embodiment, a semiconductor device 102 (e.g., a MOSFET) is used to turn off an inductive load 300 such as a solenoid. Because an inductive load 300 stores energy in its magnetic field while current flows through it, when the inductive load is turned off, it generates flyback energy that is governed by expression (1) below:

$$E_{flyback} \propto \tfrac{1}{2} L * I^2 \qquad (1)$$

where L is the inductance and I is the current through the inductive load just prior to its being turned off. This flyback energy can result in an increase in junction temperature of the semiconductor device 102 just after the device turns off. Thus, unacceptably high levels of flyback energy can cause undesirable heating of the device, and can cause device failure.

The increase in junction temperature due to flyback energy can be monitored by using either temperature rate sensor 116 or 190 as previously discussed. In one embodiment, after integrating over a time window (e.g., by use of temperature rate sensor 190), an integration result from the flyback energy may indicate that the temperature rise of the device 102 is too high during turn off. If the integration result is greater than a reference level, a diagnostic fault signal is made available to a system microcontroller. The system microcontroller can then use the fault flag in a suitably manner to adjust the temperature rise or notify the user. FIG. 3 shows one configuration in which an inductive load 300 could be coupled to the device 102 of the circuit so as to generate flyback energy, although other configurations are contemplated as falling within the scope of the present invention.

Although the invention has been shown and described with respect to a certain aspect or various aspects, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A circuit, comprising:
   a temperature rate sensor configured to monitor the temperature of a semiconductor device during a first state and selectively switch the semiconductor device from the first state to a second state if the temperature increases at a rate that has a predetermined relationship with a temperature rate function, the temperature rate sensor comprising:
   a temperature sensor configured to provide the temperature of the semiconductor device;
   a differentiator configured to provide a differentiated temperature by differentiating the temperature; and
   a comparator configured to compare the differentiated temperature to an adjustable reference level representative of the temperature rate function, and to provide a comparator output value therefrom; and
   a logic circuit that is coupled to an output node of the comparator, wherein the logic circuit utilizes the comparator output value to provide a logic control signal to switch the semiconductor device from the first state to the second state.

2. The circuit of claim 1 wherein the semiconductor device comprises a MOSFET.

3. A circuit for protection from over-stress, comprising:
   a temperature rate sensor configured to monitor a temperature of a semiconductor device and selectively provide an output signal based on whether the temperature increases at a rate that has a predetermined relationship with a temperature rate function;
   an integrator configured to, based on the output signal, selectively integrate the temperature during an integration period; wherein the semiconductor device is turned off if the integrated temperature measured over the integration period has a predetermined relationship with an integrator reference level.

4. The circuit of claim 3, further comprising:
   an inductor configured to generate flyback energy when turned from an on-state to an off-state by the semiconductor device;
   wherein the circuit is configured to provide a diagnostic fault flag if the flyback energy causes the rate of temperature increase to have the predetermined relationship with the temperature rate function.

5. The circuit of claim 3, wherein the temperature rate sensor comprises:
   a temperature sensor configured to provide the temperature of the semiconductor device; and
   a differentiator configured to aid in designating the start of the integration period.

6. The circuit of claim 5 wherein the temperature rate sensor further comprises:
   a comparator configured to compare an output of the differentiator to a reference level, and to provide a comparator output value therefrom; and
   a time period circuit configured to receive the comparator output value and provide the integration period therefrom.

7. The circuit of claim 6 wherein the temperature rate sensor further comprises:
   a second comparator configured to compare the integrated temperature to an integrator temperature function, and provide a second comparator output value therefrom;
   wherein the second comparator output value can facilitate switching the semiconductor device from a first state to a second state.

8. A method for protecting a semiconductor device from over-stress, comprising:
   monitoring the temperature of a semiconductor device during an on-state;
   comparing a temperature rate associated with the monitored temperature to a temperature rate function;
   selectively integrating the temperature of the semiconductor device over a time window, where the selective integration is based on the comparison of the temperature rate to the temperature rate function; and
   comparing the integrated temperature to an integrator reference level to facilitate switching the device from the on-state to an off-state.

9. The method of claim 8, wherein the integrating starts at a time related to when the monitored temperature favorably compares to the temperature rate function.

10. The method of claim 9, further comprising:
    measuring the absolute temperature of the semiconductor device; and
    switching the semiconductor device to an off-state if the absolute temperature exceeds a maximum temperature.

11. A circuit for protection from over-stress, comprising:
    means for monitoring the temperature of a semiconductor device during an on-state and for comparing a temperature rate associated with the monitored temperature to a temperature rate function; and
    circuitry to facilitate switching the semiconductor device from a first state to a second state if the temperature rate favorably compares to the temperature rate function;
    integration means for integrating the temperature of the semiconductor device over a time window; and
    means for providing an enabling signal that is representative of the time window for which integration is carried out.

12. The circuit of claim 11, further comprising:
    means for comparing the integrated temperature to a integrated temperature function to facilitate switching the device from the on-state to an off-state.

13. The method of claim 12, further comprising:
    diagnostic circuitry for delivering a diagnostic signal from the circuit, wherein the diagnostic signal is indicative of an excessive temperature in the circuit.

14. A circuit for protection from over-stress, comprising:
    a temperature rate sensor configured to monitor a temperature of a semiconductor device and integrate the temperature during an integration period, the temperature rate sensor comprising:
    a temperature sensor configured to provide the temperature of the semiconductor device;
    a differentiator configured to aid in designating the start of the integration period; and
    an integrator configured to integrate the temperature during the integration period;

wherein the integration period relates to a time at which a rate of temperature increase has a pre-determined relationship with a temperature rate function.

15. A circuit for protection from over-stress, comprising:

a temperature rate sensor configured to monitor a temperature of a semiconductor device and integrate the temperature during an integration period;

wherein the integration period relates to a time at which a rate of temperature increase has a pre-determined relationship with a temperature rate function; and an inductor configured to generate flyback energy when turned from an on-state to an off-state by the semiconductor device;

wherein the circuit is configured to provide a diagnostic fault flag if the flyback energy causes the rate of temperature increase to have the predetermined relationship with the temperature rate function.

\* \* \* \* \*